United States Patent
Fujita

(12) 
(10) Patent No.: US 6,256,226 B1
(45) Date of Patent: Jul. 3, 2001

(54) EEPROM WRITE DEVICE

(75) Inventor: Masahide Fujita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/561,955

(22) Filed: May 1, 2000

(30) Foreign Application Priority Data

Nov. 9, 1999 (JP) ................................... 11-318555

(51) Int. Cl.$^7$ ................................... G11C 16/04
(52) U.S. Cl. ................................ 365/185.05; 365/189.01; 365/191
(58) Field of Search .................... 365/185.05, 189.07, 365/191

(56) References Cited

U.S. PATENT DOCUMENTS 5,574,926 * 11/1996 Miyazawa et al. .................. 395/800
5,844,843 * 12/1998 Matsubara et al. ............. 365/185.24
B1 6,181,598 * 1/2001 Matsubara et al. ............. 364/185.11

FOREIGN PATENT DOCUMENTS 63-223901  9/1988  (JP) ............................... G05B/15/02

* cited by examiner

*Primary Examiner*—Vu A. Le
*Assistant Examiner*—Tuan T. Nguyen
(74) *Attorney, Agent, or Firm*—Sughrue, Mion, Zinn, Macpeak & Seas, PLLC

(57) ABSTRACT

An EEPROM write device includes an ECU 2A having a microcomputer 3A including a CPU 30A, an EEPROM 31 and a boot program 32A, and an external write device 1A which communicates serial signals SE and SR with the CPU, in which the ECU includes write control means associated with the CPU, the write control means generates a write enable signal to the CPU in response to a receive start of the serial signal from the external write device, and the CPU switches from a normal operation mode to a write mode to the EEPROM in response to the write enable signal, to thereby rewrite the contents of the EEPROM.

3 Claims, 7 Drawing Sheets

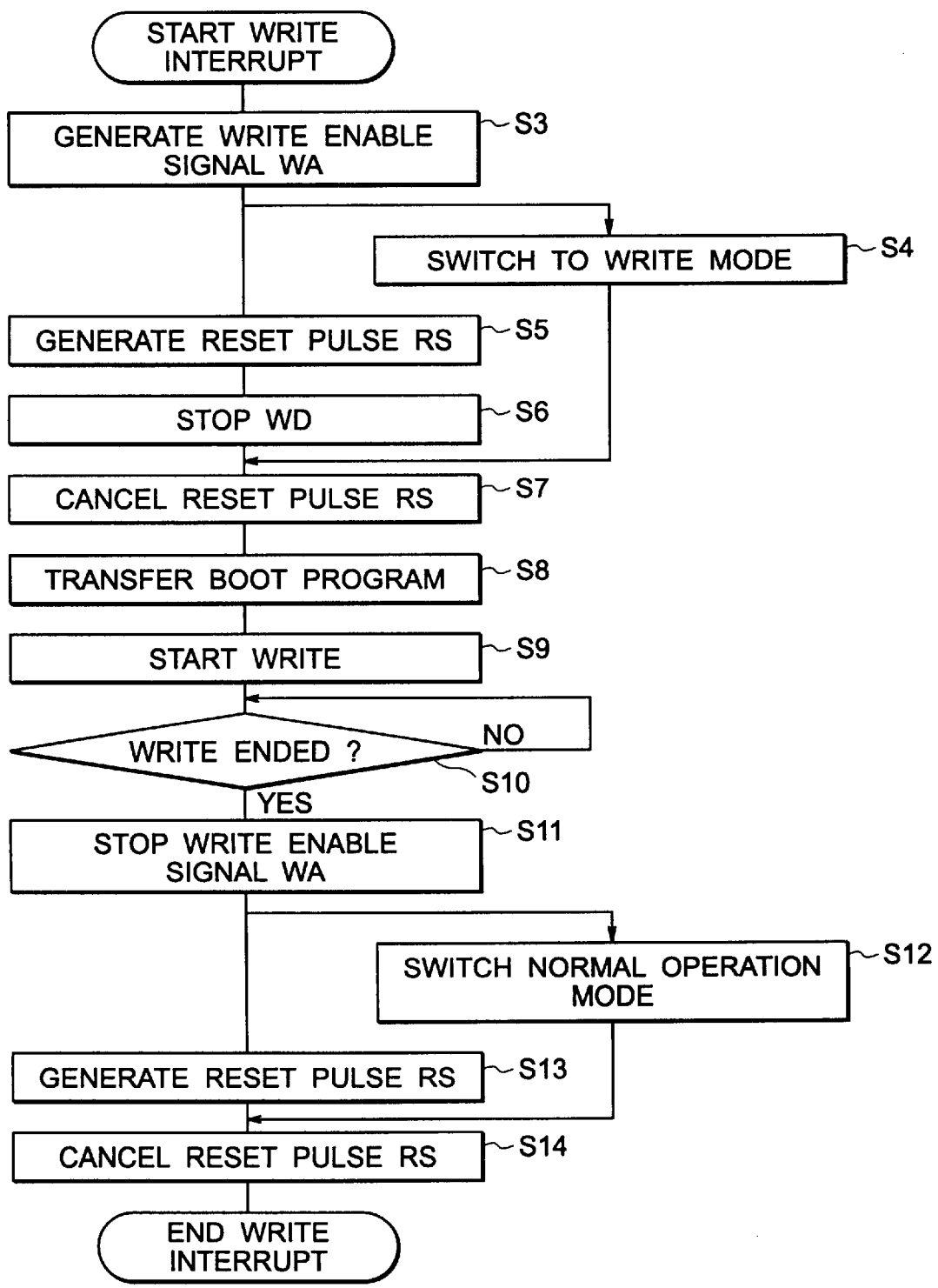

EEPROM WRITE DEVICE

BACKGROUND OF THE INVENTION

1. Field of the Invention

The present invention relates to an EEPROM write device which rewrites an EEPROM such as a flash memory installed in, for example, an ECU (electronic control unit) of a vehicle according to a serial signal from the external, and more particularly to an EEPROM write device which is adapted to be automatically writable at the ECU side according to an input of only the serial signal from an external write device and simplifies a communication terminal structure between the external write device and the ECU and a circuit structure thereof.

2. Description of the Related Art

Up to now, an ECU mounted on a vehicle stores various program for vehicle control therein. Also, the contents of control program are written in an EEPROM from which data may be electrically erased and into which data may be rewritten, and are appropriately rewritten by connection to the external write device if necessary, as disclosed, for example, in Japanese Patent Application Laid-open No. Sho 63-223901 (Patent No. 2753225).

In general, the write processing of the EEPROM is implemented by supplying a write enable signal to an IC circuit containing the EEPROM and supplying address data and memory data after the IC circuit is switched to a write mode.

FIG. 5 is a block diagram showing the structure of a conventional EEPROM write device using an external write device.

Referring to FIG. 5, an external write device 1 is connected to an ECU 2 mounted on a vehicle when a write processing is conducted and produces a write enable signal WA and a serial signal SE.

The ECU 2 includes input terminal 21 and 22 as well as an output terminal 23 for connection to the external write device 1 so as to input the write enable signal WA and the serial signal SE through the input terminals 21 and 22 and output a serial signal SR to the external write device 1 through the output terminal 23.

The ECU 2 includes a microcomputer 3 which constitutes a control processing unit, a write control circuit 4 associated with the microcomputer 3, a reset pulse generating circuit 5, a CPU operation monitoring circuit 6, a communication circuit 7 and a gate circuit 8.

The microcomputer 3 includes a CPU 30 that constitutes a microcomputer main body, an EEPROM 31 such as a flash memory belonging to the CPU 30, a boot program 32 and a RAM 33.

Hereinafter, a description will be given of an example in which the flash memory 31 is employed as the EEPROM.

The boot program 32 stores a start program for write preparation or the like therein, and the flash memory 31 stores a sequence program of the CPU 30 and other programs therein.

The write control circuit 4 converts the write enable signal WA supplied from the external write device 1 into a write mode set signal WM and inputs the signal WM to the CPU 30 within the microcomputer 3.

The write mode set signal WM conducts write enablement and the decision of the operation mode which are necessary for the microcomputer 3.

The reset pulse generating circuit 5 generates a reset pulse RS for the CPU 30 within the microcomputer 3 in response to the write enable signal WA supplied from the external write device 1.

The CPU operation monitoring circuit 6 generates the reset pulse RS in response to the presence/absence of a watchdog signal which is periodically supplied from the CPU 30 within the microcomputer 3.

The communication circuit 7 conducts bidirectional communication of the serial signals SE and SR between the external write device 1 and the microcomputer 3.

The gate circuit 8 allows the reset pulse RS to pass and inputs it to the CPU 30 so as to give preference to the reset pulse RS from the reset pulse generating circuit 5 rather than the reset pulse RS from the CPU operation monitoring circuit 6.

Subsequently, a description will be given of the operation of the conventional EEPROM write device shown in FIG. 5 with reference to FIG. 6 (normal operation) and a flowchart of FIG. 7 (write interrupt).

It is assumed that arbitrary system control program is written in a flash memory 31 within the microcomputer 3.

Referring to FIG. 6, when the ECU 2 and the microcomputer 3 are first operated upon turning on a power (step S1), a normal control program starts, and the ECU 2 and the microcomputer 3 are operated according to the normal system control program (step S2).

When the write enable signal WA is supplied from the external write device 1, write interrupt (see FIG. 7) takes place, and when write interrupt is completed, processing is returned to a processing routine shown in FIG. 6. Then, the power is turned off (step S20) to end the normal processing shown in FIG. 6.

Referring to FIG. 7, the write control circuit 4 first generates the write mode set signal WM for write enable and operation mode setting of the microcomputer 3 in response to the write enable signal WA (step S3). In response to the signal WM, the microcomputer 3 executes the switching processing to the write mode (step S4).

Also, while the write enable signal WA is supplied, the reset pulse generating circuit 5 supplies the reset pulse RS to the microcomputer 3 (step S5) to stop the watchdog signal WD (step S6).

After completion of the above processing steps S3 to S6, the reset pulse generating circuit 5 stops the supply of the reset pulse RS to the microcomputer 3 (step S7). As a result, the microcomputer 3 makes a transition to the operation at the write mode, and the contents of the built-in boot program 32 are transferred and start (step S8).

After the boot program 32 starts, the external write device 1 and the microcomputer 3 start data write processing in the flash memory 31 based on the serial signal SE through communication of the serial signals SE and SR (step S9).

Then, it is judged whether an input of the serial signal SE (write processing) is completed, or not (step S10), and if it is judged that the write processing is completed (that is, YES), the external write device 1 stops the supply of the write enable signal WA in response to the serial signal SR from the CPU 30 which is indicative of the completion of the write processing (step S11).

As a result, the microcomputer 3 executes the switching processing to the normal operation mode (step S12).

At the same time, the CPU operation monitoring circuit 6 inputs the reset pulse RS to the CPU 30 through the gate circuit 8 (step S13).

In other words, the reset control operation by the reset pulse generating circuit 5 stops, and the reset pulse RS from the CPU operation monitoring circuit 6 is supplied to the microcomputer 3.

After the completion of the above processing steps S11 to S13, the reset pulse generating circuit 5 stops the supply of the reset pulse RS to the microcomputer 3 (step S14).

As a result, the processing routine shown in FIG. 7 is completed, and the normal system control program (see FIG. 6) starts, and processing is returned to the original operation of the ECU 2.

As described above, upon stopping the supply of the write enable signal WA at the time of completing write operation, the write mode is cancelled in the microcomputer 3 to switch to the operation mode using the normal system control program (step S2).

However, the above conventional device requires the input terminal 21 for transmitting the write enable signal WA from the external write device 1 to the ECU 2 as a structure not involved in the normal control operation but involved only in the data write operation.

Also, although not shown in FIG. 5, it is necessary to provide not only an exclusive input/output terminal for the write enable signal WA but also a wire (harness) connecting the external write device 1 and the ECU 2 to each other therebetween.

As described above, in the conventional EEPROM write device, it is necessary to transmit the exclusive write enable signal WA from the external write device 1 to the ECU 2 in order to switch the operation mode of the microcomputer 3 installed with the flash memory 31 to the write mode. Accordingly, there arises such a problem that the input terminal 21 and the like for the write enable signal WA are required, and the circuit structure cannot be simplified.

SUMMARY OF THE INVENTION

The present invention has been made in order to solve above problems with the conventional EEPROM write device, and therefore an object of the present invention is to provide an EEPROM write device which is structured so as to automatically reach write enablement state at an ECU side according to an input of only a serial signal from an external write device without supplying a write enable signal to an ECU from the external write device, to thereby simplify a communication terminal structure between the external write device and the ECU and a circuit structure thereof.

In order to achieve the above object, according to the present invention, there is provided an EEPROM device which rewrites the contents of an EEPROM according to a serial signal, comprising: an ECU having a CPU and the EEPROM and a boot program which belong to the CPU; and an external write device connected to the ECU for communicating the serial signal with the CPU, wherein the ECU includes write control means associated with the CPU, wherein the write control means generates a write enable signal to the CPU in response to a receive start of the serial signal from the external write device, and wherein the CPU switches from a normal operation mode to a write mode to the EEPROM in response to the write enable signal.

Also, according to the present invention, in the EEPROM write device, the ECU includes a write control circuit and a reset pulse generating circuit which are associated with the CPU and the boot program; the write control means comprises the boot program, the write control circuit and the reset pulse generating circuit; the boot program generates the write enable signal in response to the receive start of the serial signal from the external write device; the write control circuit generates a write mode set signal for switching the mode of the CPU to the write mode in response to the write enable signal; and the reset pulse generating circuit generates a reset pulse to the CPU when the write mode starts or ends.

Further, according to the present invention, in the EEPROM write device, the write control means comprises the boot program.

BRIEF DESCRIPTION OF THE DRAWINGS

Features of the present invention will be best understood from the detailed description below when read in conjunction with the accompanying drawings in which:

FIG. 7 is a flowchart showing the interrupt operation of the conventional EEPROM write device.

DETAILED DESCRIPTION OF THE PREFERRED EMBODIMENTS

Hereinafter, a description will be given in more detail of preferred embodiments of the present invention with reference to the accompanying drawings.
(First Embodiment)

Now, a first embodiment of the present invention will be described following the illustration of the accompanying drawings.

Figure 1:
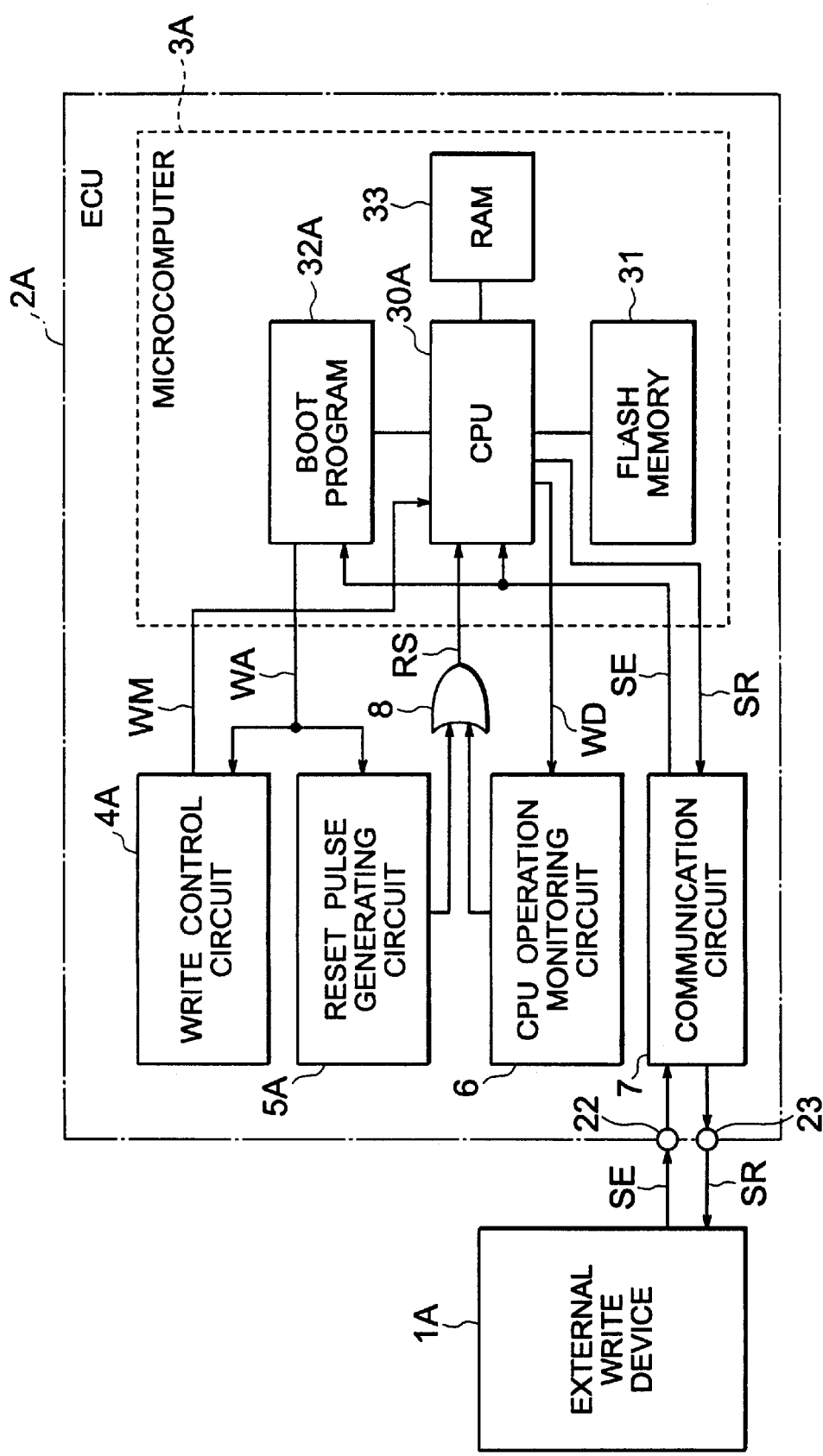
FIG. 1 is a block diagram showing the structure of an EEPROM write device in accordance with a first embodiment of the present invention.
Figure 5:
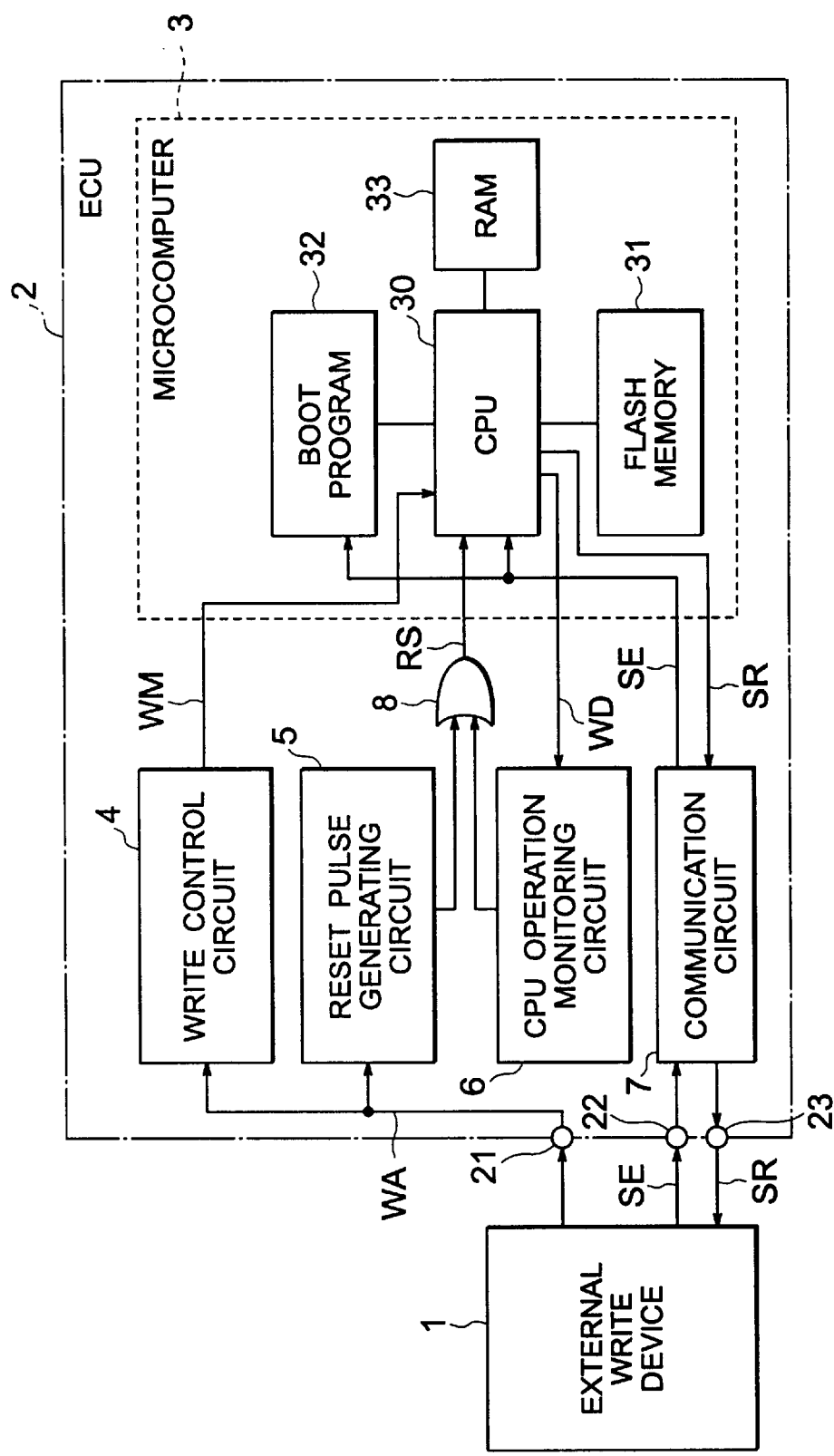
FIG. 5 is a block diagram showing a conventional EEPROM write device.

FIG. 1 is a block diagram showing an EEPROM write device in accordance with a first embodiment of the present invention, in which the same parts as those described in the above with reference to FIG. 5 are designated by identical reference symbols and their detailed description will be omitted.

Referring to FIG. 1, an external write device 1A outputs only a serial signal SE, and an ECU 2A includes only an input terminal 22 and an output terminal 23 as communication terminals.

Also, the ECU 2A includes a microcomputer 3A, a write control circuit 4A, a reset pulse generating circuit 5A, a CPU operation monitoring circuit 6, a communication circuit 7 and a gate circuit 8.

The microcomputer 3A includes a flash memory and a RAM 33 which are the same as those described above, and a CPU 30A and a boot program 32A which have an automatic start function at the time of write enablement.

The write control circuit 4A and the reset pulse generating circuit 5A within the ECU 2A are associated with the CPU 30A and the boot program 32A within the microcomputer 3A.

The boot program 32A, the write control circuit 4A and the reset pulse generating circuit 5A which are associated with the CPU 30A structure write control means for generating a write enable signal WA and a write mode set signal WM to the CPU 30A in response to the receive start of the serial signal SE from the external write device 1A.

In other words, the boot program 32A generates the write enable signal WA in response to the receive start of the serial signal SE from the external write device 1A, and the write control circuit 4A generates the write mode set signal WM for switching the CPU 30A to the write mode in response to the write enable signal WA.

The reset pulse generating circuit 5A generates the reset pulse RS to the CPU 30A when the write mode starts or ends, in response to the write enable signal WA, and in association with the CPU operation monitoring circuit 6.

The CPU 30A is so designed as to switch from the normal operation mode to the write mode to the flash memory 31 in response to the write mode set signal WM based on the write enable signal WA.

In FIG. 1, the write enable signal WA is not supplied from the external write device 1 but is automatically produced within the ECU 2A only through serial communication between the external write device 1A and the ECU 2A and then processed.

Subsequently, the operation of the EEPROM write device shown in FIG. 1 according to the first embodiment of the present invention will be described with reference to a flowchart shown in FIG. 2.

Figure 2:
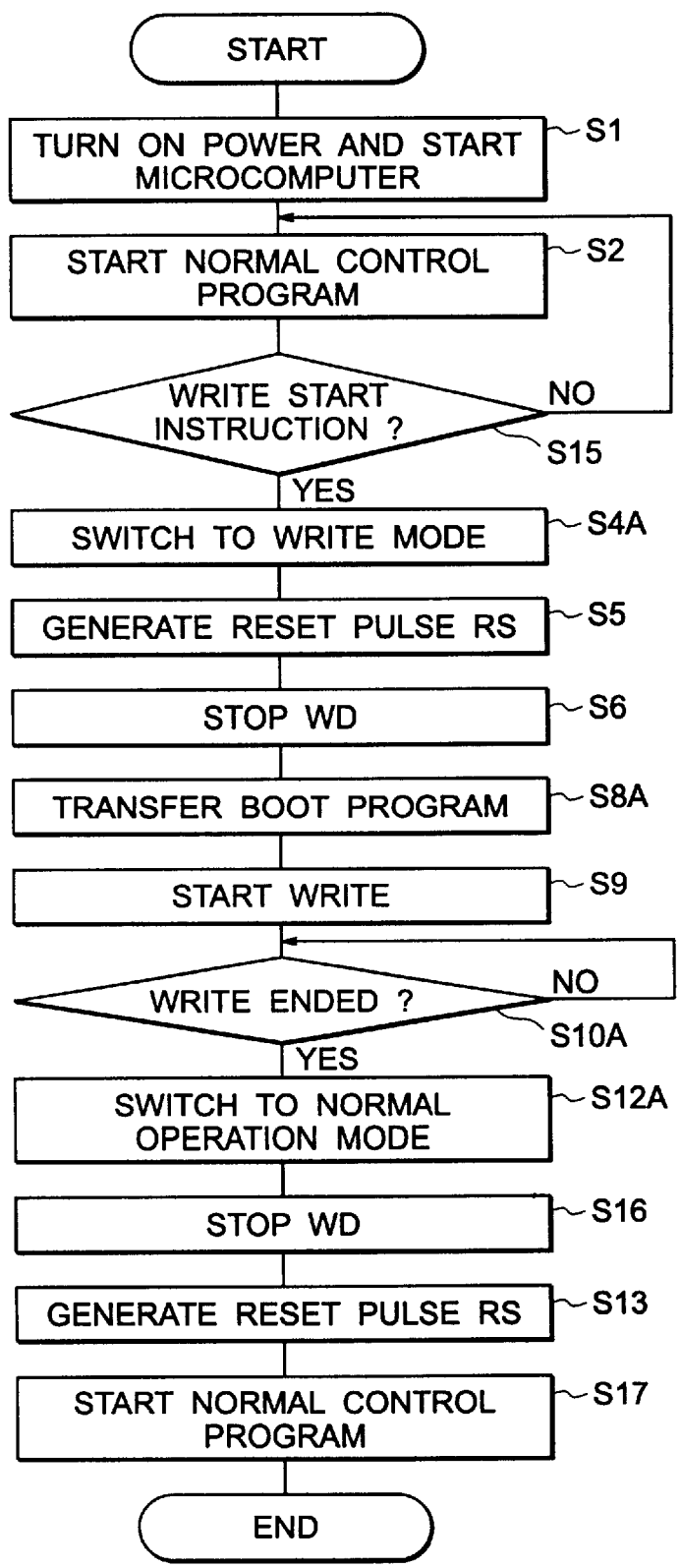
FIG. 2 is a flowchart showing the operation of the EEPROM write device in accordance with the first embodiment of the present invention.
Figure 6:
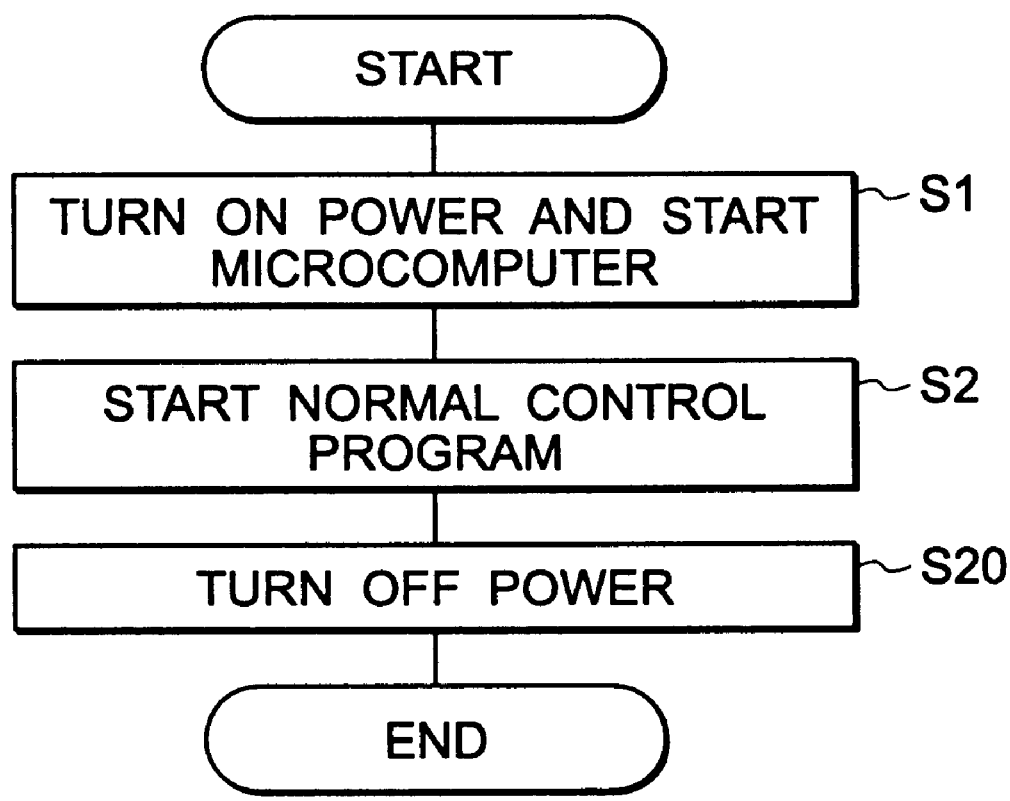
FIG. 6 is a flowchart showing the normal operation of the conventional EEP ROM write device.

In FIG. 2, the same steps as those described above (see FIG. 6) are designated by identical reference and their detailed description will be omitted. Also, cancel steps S7 and S14 of the reset pulse RS subsequent to the steps S6 and S13 are the same as those described above and their illustrations in the figure will be omitted.

First, in step S2 after a power turns on, the microcomputer 3A which is in operation under the normal system control program conducts communication with the external write device 1A.

Also, the CPU operation monitoring circuit 6 monitors operation of the microcomputer 3A by means of the watchdog signal WD for confirming the operation of the microcomputer 3A, and sends out the reset pulse RS to the microcomputer 3A when detecting the abnormality of the watchdog signal WD.

In this situation, when the write operation starts with respect to the flash memory 31, the external write device 1A transmits the serial signal SE including write enable information to the microcomputer 3A within the ECU 2A.

At this time, the microcomputer 3A judges the presence/absence of an write start instruction (step S15), and judges from an input of the write enable information that the write start instruction exists (that is, YES) to switch the mode to the write mode (step S4A).

In other words, the microcomputer 3A inputs the write enable signal WA to the write control circuit 4A and the reset pulse generating circuit 5A within the ECU 2A if the write enable information is included in communication information from the external write device 1A.

Upon reception of the write enable signal WA from the microcomputer 3A, the write control circuit 4A generates the write mode set signal WM and inputs the signal WM to a write enable terminal and a mode set terminal of the microcomputer 3A.

Upon reception of the write enable signal WA rom the microcomputer 3A, the reset pulse generating circuit 5A generates the reset pulse RS and inputs the reset pulse RS to the microcomputer 3A through the gate circuit 8 (step S5).

In response to the input of the reset pulse Rs, the microcomputer 3A stops the watchdog signal WD (step S6) and transmits a receive confirmation signal of the write enable information to the external write device 1A.

In this situation, the gate circuit 8 inputs the reset pulse RS from the reset pulse generating circuit 5A to the microcomputer 3A preferentially.

The external write device 1A starts its write operation after the serial signal SR including the receive confirmation signal of the write enable information is transmitted from the microcomputer 3A to the external write device 1A.

In other words, the external write device 1A transfers the contents of the boot program 32A for automatically starting the write operation (step S8A) and starts the write operation with respect to the flash memory 31 (step S9).

In this situation, the microcomputer 3A starts its write operation after it inputs the write mode set signal WM from the write control circuit 4A and is then reset by the reset pulse RS from the reset pulse generating circuit 5A.

Thereafter, the microcomputer 3A judges the presence/absence of the write end information which is transmitted from the external write device 1A to the microcomputer 3A (step S10A), and if the microcomputer 3A judges that there exists the write end information from the external write device 1A (that is, YES), the microcomputer 3A stops the write enable signal WA and switches the mode to the normal operation mode (step S12A).

In other words, the write control circuit 4A stops the output of the write mode set signal WM to the microcomputer 3A in response to the stop of the write enable signal WA.

Also, the reset pulse generating circuit 5A stops control of the microcomputer 3A by means of the reset pulse RS in response to the stop of the write enable signal WA. As a result, the reset terminal control of the microcomputer 3A is determined by the reset pulse RS from the CPU operation monitoring circuit 6.

In addition, since the microcomputer 3A in write operation does not output the watchdog signal WD (step S16), the CPU operation monitoring circuit 6 outputs the reset pulse RS to the microcomputer 3A (step S13). With those operation, the microcomputer 3A restarts the normal system control program operation (step S17).

As described above, at the time of writing data in the flash memory 33, the external write device 1A transmits the write enable information to the ECU 2A through the input terminal 22 (communication interface), and the ECU 2A automatically makes a transition to the write mode in response to the write enable information (step S15) (step S4A).

Also, upon reception of a transition complete signal (serial signal SR) to the write mode through the output terminal 23 (communication interface) from the ECU 2A, the external write device 1A transmits the write data to the flash memory 33 (step S9) and upon the completion of transmission of the write data, the external write device 1A transmits the transmission end signal.

On the other hand, the ECU 2A writes the write data transmitted from the external write device 1A in the flash memory 33, and upon the reception of transmission end signal (step S10A), the ECU 2A makes a transition to the normal operation mode (step 12A).

As described above, the write enable information is transmitted using the normal communication interface (serial communication: SCI) between the external write device 1A and the ECU 2A without supplying the write enable signal WA from the external write device 1A, thereby making it possible to realize the write operation within the ECU 2A.

Accordingly, it is sufficient that the ECU 2A is provided with only the communication terminals 22 and 23 for the serial signals SE and SR, and the exclusive write communication terminal (the input terminal 21 in FIG. 5) to the flash memory 33 becomes unnecessary, thereby making it possible to simplify the circuit structure to reduce the costs.

Also, since the ECU 2A has the structure including the write control circuit 4A, the reset pulse generating circuit 5A and the gate circuit 8 which is similar to the conventional ECU 2 (see FIG. 5), the ECU 2A can be connected with the external write device 1 in the prior art simply by addition of the input terminal 21, and can share hardware with the conventional device.

(Second Embodiment)

In the above first embodiment, the ECU 2A having the write control circuit 4A and the reset pulse generating circuit 5A (see FIG. 1) is described. The functions of the write control circuit 4A and the reset pulse generating circuit 5A may be contained in the boot program within the microcomputer.

With this structure, the write control circuit 4A, the reset pulse generating circuit 5A and the gate circuit 8 are omitted, and the structure within the ECU can be further simplified.

Hereinafter, the second embodiment of the present invention in which the write control means is structured by only the boot program will be described with reference to the accompanying drawings.

Figure 3:
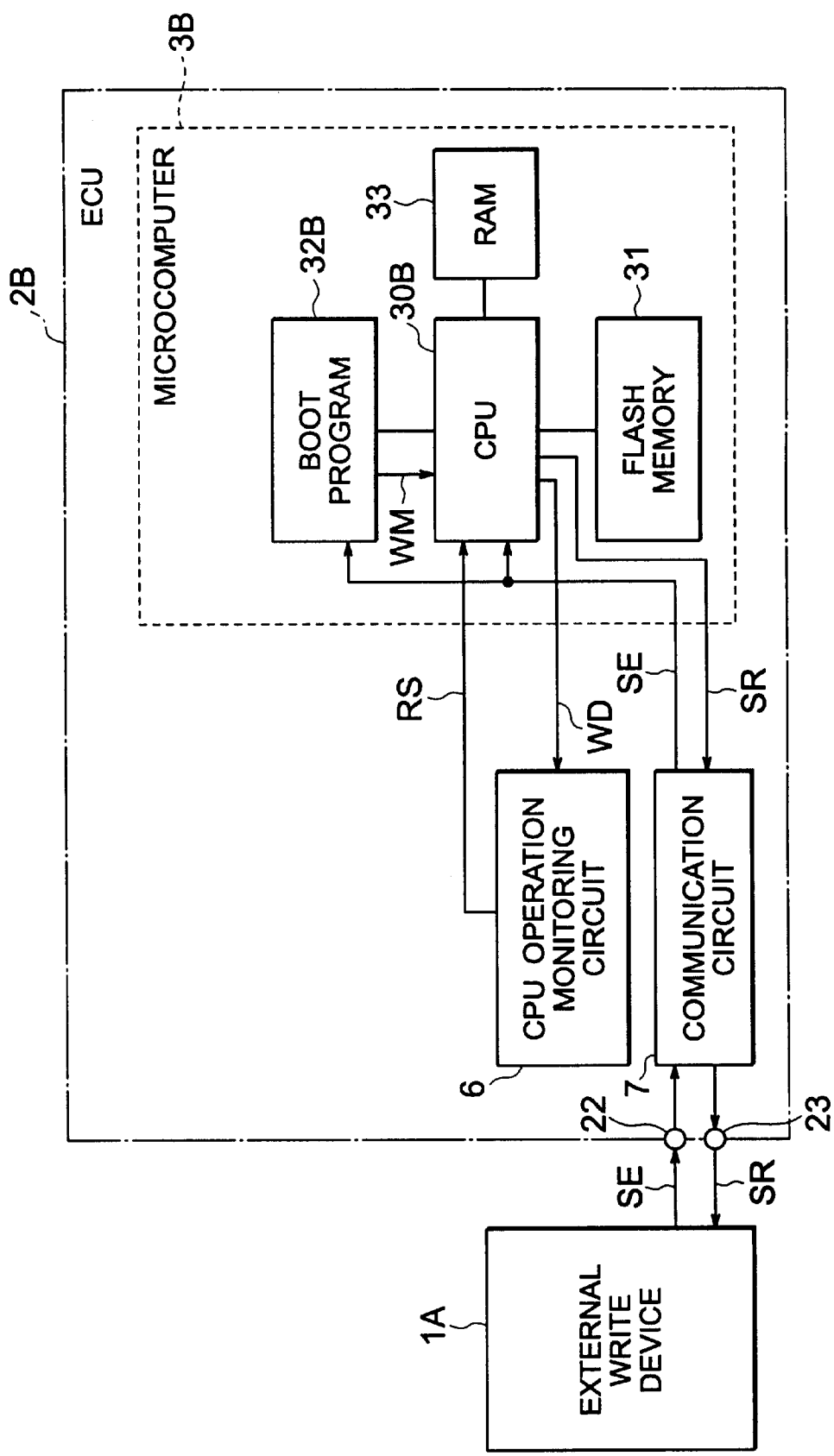
FIG. 3 is a block diagram showing the structure of an EEPROM write device in accordance with a second embodiment of the present invention.

FIG. 3 is a block diagram showing the structure of an EEPROM write device in accordance with a second embodiment of the present invention, in which the same parts as those described above (see FIG. 1) are designated by identical reference symbols and their detailed description will be omitted.

Referring to FIG. 3, an ECU 2B includes only a microcomputer 3B, a CPU operation monitoring circuit 6 and a communication circuit 7. The microcomputer 3B includes a CPU 30B and a flash memory 31, a boot program 32B and a RAM 33 which belong to the CPU 30B. The boot program 32B associated with the CPU 30B structures the write control means.

In this case, the write enable signal is processed between the CPU 30B and the boot program 32B in response to the communication of the write enable information between the external write device 1A and the ECU 2B.

Subsequently, the operation of the EEPROM write device shown in FIG. 3 according to the second embodiment of the present invention will be described with reference to a flowchart shown in FIG. 4.

Figure 4:
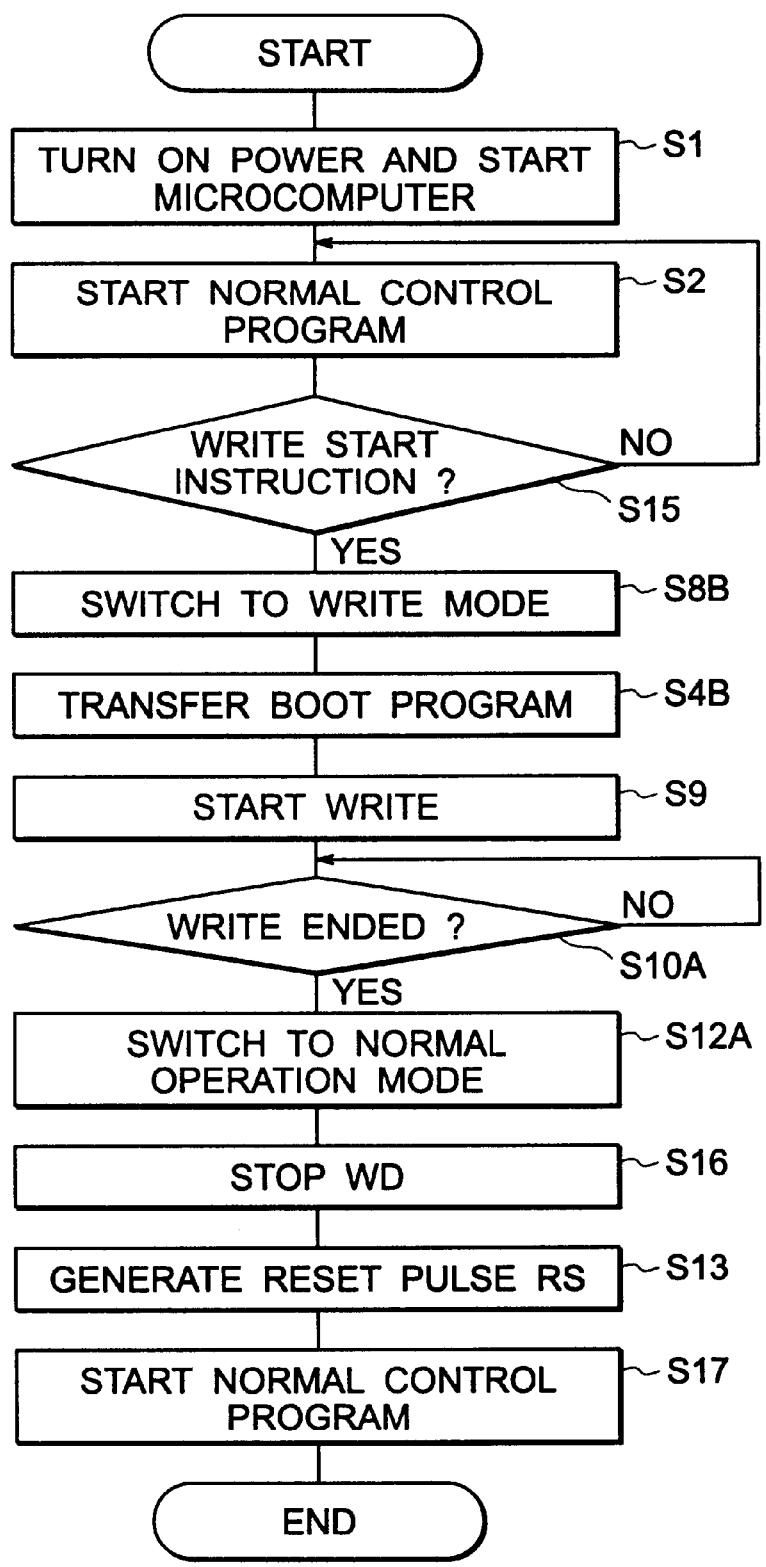
FIG. 4 is a flowchart showing the operation of the EEPROM write device in accordance with the second embodiment of the present invention.

In FIG. 4, the same steps as those described above (see FIG. 2) are designated by identical reference symbols and their detailed description will be omitted.

First, the microcomputer 3B which is in operation under the system control program conducts communication with the external write device 1A, and the CPU operation monitoring circuit 6 generates the reset pulse RS when detecting the abnormality of the watchdog signal WD.

As in the above description, when the write operation is to be started, the external write device 1A transmits the write enable information to the microcomputer 3B and starts its write operation after the receive confirmation signal (transition complete signal) is transmitted from the microcomputer 3B to the external write device 1A (step S9).

Also, the microcomputer 3B makes a transition to the write mode in response to the write enable information from the external write device 1A (step S15) and transmits the receive confirmation signal to the external write device 1A to start the write operation (step S9).

Further, ending the write operation is conducted in response to the write end information (step S10A) transmitted from the external write device 1A to the microcomputer 3B, and the microcomputer 3B makes a transition to the normal operation mode according to the write end information from the external write device 1A and restarts the system control program operation (step S17).

In this case, in step S15, if it is judged that there is a write start instruction (that is, YES), switching to the write mode (step S4B) is executed, and subsequently the contents of the boot program 2B including the functions of the write control circuit and the reset pulse generating circuit are transferred (step S8B).

Accordingly, the boot program 32B generates the write mode set signal WM in response to the write enable information from the external write device 1A and inputs the signal WM to the microcomputer 3B to switch the mode of the microcomputer 3B to the write mode.

As described above, since all the functions of the write control means are made to be included within the boot program 32B, the hardware structure within the ECU 2B is further simplified, thereby making it possible to reduce the costs.

In the above respective embodiments, a case in which the flash memory 31 is used as the EEPROM within the microcomputer is described. Alternatively, an EEPROM other than the flash memory 31 may be employed.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An EEPROM write device which rewrites the contents of an EEPROM according to a serial signal, comprising:

an ECU having a CPU and said EEPROM and a boot program which belong to said CPU; and an external write device connected to said ECU for communicating the serial signal with said CPU, wherein said ECU includes write control means associated with said CPU, wherein said write control means generates a write enable signal to said CPU in response to a receive start of the serial signal from said external write device, and wherein said CPU switches from a normal operation mode to a write mode to said EEPROM in response to the write enable signal.

2. The EEPROM write device as claimed in claim 1, wherein said ECU includes a write control circuit and a reset pulse generating circuit which are associated with said CPU and said boot program, wherein said write control means comprises said boot program, said write control circuit and said reset pulse generating circuit, wherein said boot program generates said write enable signal in response to the receive start of the serial signal from said external write device, wherein said write control circuit generates a write mode set signal for switching the normal operation mode of said CPU to said write mode in response to said write enable signal, and wherein said reset pulse generating circuit generates a reset pulse to said CPU when said write mode starts or ends.

3. The EEPROM write device as claimed in claim 1, wherein said write control means comprises said boot program.

* * * * *